US010897225B1

United States Patent
Strom et al.

(10) Patent No.: US 10,897,225 B1
(45) Date of Patent: Jan. 19, 2021

(54) OSCILLATOR FAILURE DETECTION CIRCUIT

(71) Applicant: International Business Machines Corporation, Armonk, NY (US)

(72) Inventors: James Strom, Rochester, MN (US); Matthew James Paschal, Rochester, MN (US); Bruce George Rudolph, Rochester, MN (US); Daniel M. Dreps, Georgetown, TX (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 16/583,898

(22) Filed: Sep. 26, 2019

(51) Int. Cl.
| | |
|---|---|
| H03B 5/06 | (2006.01) |
| H03L 7/14 | (2006.01) |
| G01R 31/28 | (2006.01) |
| G06F 1/04 | (2006.01) |
| H03K 23/58 | (2006.01) |
| H03K 5/19 | (2006.01) |

(52) U.S. Cl.
CPC ........... *H03B 5/06* (2013.01); *G01R 31/2824* (2013.01); *G06F 1/04* (2013.01); *H03K 5/19* (2013.01); *H03K 23/58* (2013.01); *H03L 7/143* (2013.01)

(58) Field of Classification Search
CPC . H03B 5/06; H03L 7/14; H03K 23/58; H03K 5/19; G01R 31/28; G06F 1/04
USPC .......... 331/74; 327/18, 20, 47; 713/500, 502
See application file for complete search history.

(56) References Cited

U.S. PATENT DOCUMENTS

| | | | |
|---|---|---|---|
| 4,040,022 A | 8/1977 | Takii | |
| 4,672,325 A | 6/1987 | Murai | |
| 6,005,407 A | 12/1999 | Arabi et al. | |
| 6,349,391 B1 | 2/2002 | Petivan et al. | |
| 6,597,204 B2 * | 7/2003 | Imamura | G06F 1/04 327/18 |
| 6,911,873 B2 | 6/2005 | Yin et al. | |
| 6,943,634 B2 | 9/2005 | Sekimoto | |
| 7,023,250 B2 | 4/2006 | Chen | |
| 7,714,619 B2 | 5/2010 | Yamada | |

(Continued)

FOREIGN PATENT DOCUMENTS

WO        2007105153 A1        9/2007

OTHER PUBLICATIONS

Summatta et al., Simple Anti Capacitor Open-circuit Self-oscillation in a CMOS Schmitt trigger-invertor Oscillator circuit for a Fail-safe Relay Drive, Pathumwan Institute of Technology, Thailand, 2019, pp. 97-100. DOI: 10.15199/48.2019.03.23.

*Primary Examiner* — Arnold M Kinkead
(74) *Attorney, Agent, or Firm* — Jay Wahlquist

(57) ABSTRACT

A steady-state voltage on an oscillator output can be detected, independent of control signals received from other circuitry, by an oscillator failure detection circuit (OFDC) fabricated within an integrated circuit (IC). The OFDC can, in response to detecting the steady-state voltage, output an oscillator failure signal on a reference fail output. The OFDC can receive, with a first and a second buffer, an oscillator output signal from an oscillator output. Through the use of an electrically interconnected, pull-down device, pull-up network, pull-up device, pull-down network, Schmitt trigger, inverting Schmitt trigger and OR-gate, the OFDC can drive the oscillator failure signal onto an output of the OR-gate electrically connected to a reference fail output (RFO).

20 Claims, 5 Drawing Sheets

(56) References Cited

U.S. PATENT DOCUMENTS

| | | | |
|---|---|---|---|
| 10,727,820 B2 * | 7/2020 | Tt | ........................ H03K 3/0377 |
| 2009/0256600 A1 | 10/2009 | Jing | |
| 2018/0006605 A1 * | 1/2018 | Kumar | ..................... H03B 5/36 |

* cited by examiner

OSCILLATOR FAILURE DETECTION CIRCUIT

BACKGROUND

The present disclosure generally relates to oscillator circuits within electronic systems. In particular, this disclosure relates to detecting failures of oscillator circuits used to provide clock signals to electronic systems.

A clock signal is a particular type of signal that oscillates between a logical high and a logical low logic state, and can be used to coordinate the actions of elements of an integrated circuit (IC). Clocks can be used to synchronize the transfer of data between a number of latches, flip-flops, or other synchronous elements on an IC.

A clock signal can be produced by a clock generator, such as an oscillator or phase-locked loop (PLL). A distribution network can be required to supply the clock signal to the synchronous elements. The network can include a combination of tree structures and grid structures, and can also include repowering elements to increase the drive capability of the network. The distribution network can be designed to resonate in response to driving circuits.

An IC, also known as a "microchip," silicon or computer "chip," is a specially prepared piece of silicon, or other semiconductor material, into which a complex electronic circuit is etched and formed using a photolithographic process. IC types can include computer processors, memory, analog, and customizable devices. ICs can be relatively fragile, and therefore are often mounted on and/or surrounded by a protective, supportive ceramic or plastic package. Electrical connections to the chip can be provided through metal contacts, which can include pins or solder balls located on the exterior of the chip package.

ICs can have certain advantages over comparable discrete circuits, such as relatively low-cost and high-performance. The cost of an IC can be relatively low, resulting from the large number, e.g., millions, of transistors that can be simultaneously printed as a complete functional unit by photolithographic techniques, rather than constructing an equivalent circuit from individually fabricated transistors. Performance of an IC can be significantly higher than an equivalent discrete circuit, due to the high density and relatively low electrical interconnect parasitics between active devices such as transistors. Types of ICs can include analog, digital and "mixed signal" chips, i.e., chips that incorporate both analog and digital functions on the same silicon die.

SUMMARY

Embodiments can be directed towards an oscillator failure detection circuit (OFDC) fabricated within an integrated circuit (IC). The OFDC is configured to detect, independent of control signals received from other circuitry, a steady-state voltage on an oscillator output. The OFDC is further configured to, in response to detecting the steady-state voltage, output an oscillator failure signal on a reference fail output (RFO). The OFDC can include a reference clock input configured to receive an oscillator output signal from the oscillator output. The reference clock input electrically is connected to an input of a first buffer and to an input of a second buffer. The OFDC can also include a pull-down device having a control input electrically connected to an output of the first buffer. The pull-down device is configured to, in response to a signal received from the output of the first buffer, draw a node of a pull-up network to ground. The OFDC can also include a pull-up device having a control input electrically connected to an output of the second buffer. The pull-up device is configured to, in response to a signal received from the output of the second buffer, draw a node of a pull-down network to a supply voltage. The OFDC can also include a Schmitt trigger having an input electrically connected to the node of the pull-up network. An output of the Schmitt trigger is electrically connected to a first input of an OR-gate. The OFDC can also include an inverting Schmitt trigger having an input electrically connected to the node of the pull-down network. An output of the inverting Schmitt trigger is electrically connected to a second input of an OR-gate and an output of the OR-gate that is electrically connected to the RFO.

Embodiments can also be directed towards an apparatus for operating a clocked electronic system using an OFDC. The OFDC can be configured to detect, independent of control signals received from other circuitry, a steady-state voltage on an oscillator output. The OFDC can be further configured to, in response to detecting the steady-state voltage, output an oscillator failure signal on at least one RFO. The apparatus can include an IC that includes the OFDC and that further includes a reference clock input configured to receive an oscillator output signal from a multiplexer (MUX) output. The apparatus can also include the MUX. The MUX can include a first input, electrically coupled to an output of a primary oscillator and a second input, electrically coupled to an output of a secondary oscillator. The MUX can also include at least one select input, electrically connected to a select output of a service processor and an output, electrically connected to the reference clock input of the IC. The MUX can be configured to provide, based upon a logical value of a signal received at the at least one select input, a connection from an output of one of the primary oscillator and the secondary oscillator to the reference clock input of the IC. The apparatus can also include the OFDC. The OFDC can include a clock input electrically connected to the reference clock input of the IC and the at least one RFO electrically connected to the service processor. The OFDC can be configured to indicate, in response to monitoring the clock input, an oscillator failure on the at least one RFO. The apparatus can also include the service processor configured to, in response to receiving on at least one RFO, an indication of an oscillator failure, drive the at least one select input of the MUX to select an input electrically connected to the output of the secondary oscillator.

Embodiments can also be directed towards a method for operating a clocked electronic system using an OFDC. The OFDC can be configured to detect, independent of control signals received from other circuitry, a steady-state voltage on an oscillator output. The OFDC can be further configured to, in response to detecting the steady-state voltage, output an oscillator failure signal on at least one RFO. The method can include selecting, with a service processor within the electronic system, a primary oscillator as an operating oscillator for the electronic system and clocking, with the primary oscillator, the electronic system. The method can also include monitoring, with the OFDC, the operating oscillator for a failure condition and detecting, with the OFDC, the failure condition. The method can also include sending, with the OFDC, to the service processor, at least one RFO signal and selecting, with the service processor, in response to receiving at least one RFO signal from the OFDC, a secondary oscillator as an operating oscillator for the electronic system. The method can also include clocking, with the secondary oscillator, the electronic system.

The above summary is not intended to describe each illustrated embodiment or every implementation of the present disclosure.

BRIEF DESCRIPTION OF THE DRAWINGS

The drawings included in the present application are incorporated into, and form part of the specification. They illustrate embodiments of the present disclosure and, along with the description, serve to explain the principles of the disclosure. The drawings are only illustrative of certain embodiments and do not limit the disclosure.

Figure 1:
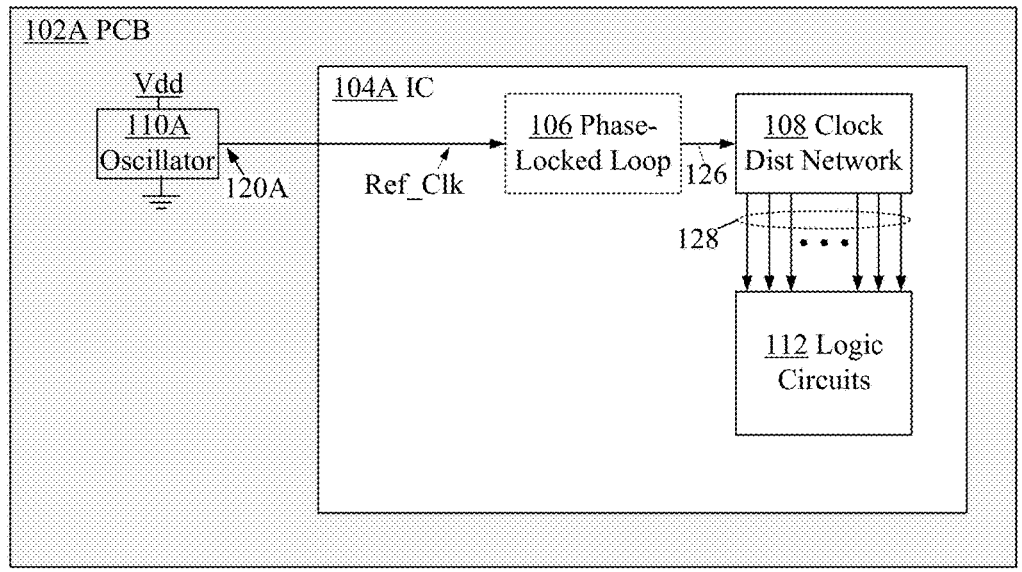
FIG. 1 includes block diagram depictions of two clocked electronic systems, according to embodiments of the present disclosure.
Figure 1:
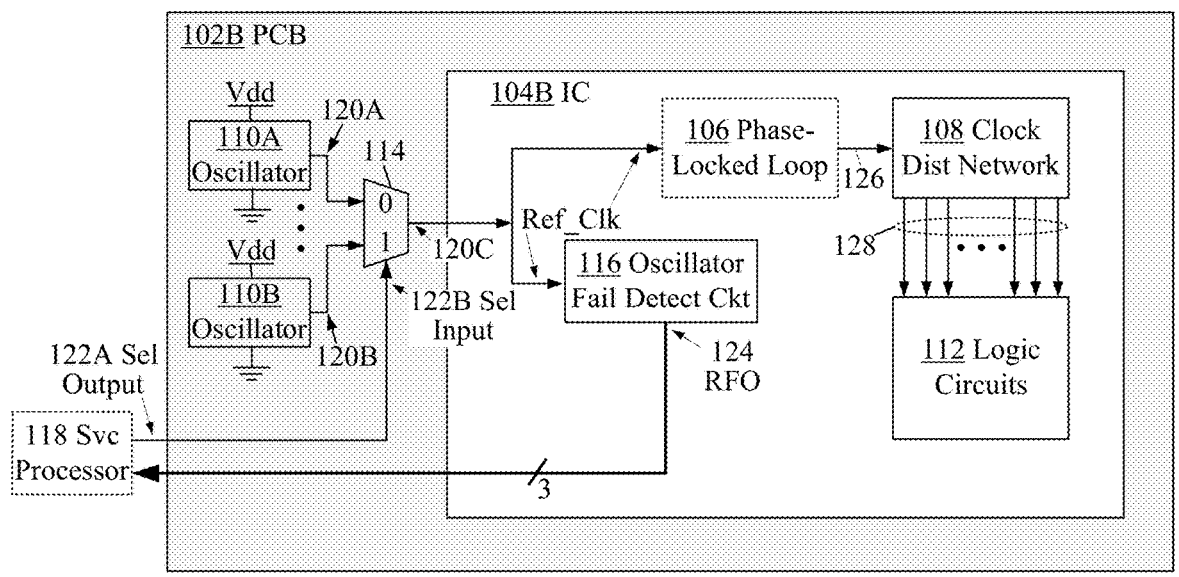

While the invention is amenable to various modifications and alternative forms, specifics thereof have been shown by way of example in the drawings and will be described in detail. It should be understood, however, that the intention is not to limit the invention to the particular embodiments described. On the contrary, the intention is to cover all modifications, equivalents, and alternatives falling within the spirit and scope of the invention.

In the drawings and the Detailed Description, like numbers generally refer to like components, parts, steps, and processes.

DETAILED DESCRIPTION

Certain embodiments of the present disclosure can be appreciated in the context of providing, independent of other circuitry, an indication of the failure of an oscillator used to clock an electronic system to electronic equipment such as servers, which can be used to provide data to clients attached to a server through a network. Such servers can include, but are not limited to web servers, application servers, mail servers, and virtual servers. While not necessarily limited thereto, embodiments discussed in this context can facilitate an understanding of various aspects of the disclosure. Certain embodiments can also be directed towards other equipment and associated applications, such as providing, independent of other circuitry, an indication of the failure of an oscillator to electronic equipment such as computing systems, which can be used in a wide variety of computational and data processing applications. Such computing systems can include, but are not limited to, supercomputers, high-performance computing (HPC) systems, and other types of special-purpose computers. Embodiments can also be directed towards providing, independent of other circuitry, an indication of the failure of an oscillator located within consumer and small office/home office (SOHO) electronic equipment such as personal computers, laptops, mobile and network server devices.

In accordance with voltages used to represent logic states within an IC, it can be understood that an input signal logical "1" state corresponds to an input voltage equivalent to an IC supply voltage, e.g., $V_{DD}$. Similarly, it can be understood that an input signal logical "0" state corresponds to an input voltage equal to 0 V or ground (GND). The signal state descriptors "0," logical "0," and logical "low" and "low" can be used interchangeably herein, without loss of meaning. Similarly, the signal state descriptors "1," logical "1," logical "high" and "high" can be used interchangeably herein, without loss of meaning.

For ease of discussion a single reference label, e.g., "Ref_Clk", can be used in conjunction with multiple descriptors to identify various entities and elements depicted in the figures and discussed in the Specification. For example, terms such as "Ref_Clk input," "Ref_Clk signal" and "Ref_Clk node," can each be understood to refer to various entities and items related to the reference clock (Ref_Clk) used within an electronic system.

In the context of the present discussion, a "service processor" can be understood to be a processor, within a computing system e.g., a computer or server, that is electrically connected to and is configured to monitor and/or display and/or report the status of components within the computing system. For example, a service processor can be interconnected to components such as processors, memory units, power supplies and data storage devices, and can be configured to monitor operating temperature, supply voltage, and any functional/operational errors reported each device.

In addition, a service processor can be configured to take certain actions in response to certain monitored computing system parameters having values outside of a specified range. For example, a service processor can monitor the overall operating temperature of the computing system, processors, and other heat-generating components such as data storage devices, and can initiate shutting down, or reducing power to certain components in response to a temperature that exceeds a predetermined limit. Such responsive actions can be particularly useful, for instance, in protecting the computing system from possible damage resulting from excessive temperature, component supply voltage, power consumption and the like.

According to embodiments of the present disclosure, an oscillator failure signal can be understood to provide a clear, unambiguous indication of an oscillator failure. For example, an oscillator failure signal can be a binary signal, where a logical "1" signal value indicates an oscillator failure, and a logical "0" signal value indicates the proper functioning of the oscillator. It can be understood that the presence of a steady-state, i.e., DC voltage on the output of an oscillator within an active electronic system indicates a failure of the oscillator.

An oscillator is generally designed into a digital system in order to provide a regularly repeating digital signal that is used to time or "clock" the electronic system. Oscillators are a critical part of a wide variety of electronic systems and devices, as they provide base reference operating frequencies for these systems and devices. For example, systems and devices clocked by oscillators include various types of computers, servers and supercomputers, cloud devices and artificial intelligence (AI) systems. Clocked devices can also include circuits such as central processing units (CPUs), graphics processing units (GPUs), application-specific integrated circuits (ASICs), and the like. It is understood that oscillators can have a high failure rate relative to other parts within electronic systems.

The above factors, in conjunction with a trend towards increasing the reliability of electronic systems, can provide incentive for including an "oscillator failure detect" circuit within the electronic system. Such a circuit can provide an indication of oscillator failure that can be used, for example, by a supervisory processor or function such as a service processor. Such a supervisory processor or function can be configured to subsequently notify a system operator or technician that the oscillator has failed, and/or can initiate a "swap" of a secondary oscillator to functionally replace the failed oscillator. These actions can be useful in significantly increasing the overall reliability of the electronic system.

A significant feature of an oscillator failure detect circuit fabricated on an IC is the ability of such a circuit to operate as a "stand-alone" circuit, i.e., independently of inputs and/or controls received from other logic/circuit functions within the IC or within the electronic system. In the event of an oscillator failure occurring at an electronic system power-up, a clock signal from the oscillator would not be available to clock other logic functions within the IC or other components of the electronic system. Thus, these other logic functions would be unable to provide inputs and/or controls to initialize or operate the oscillator failure detect circuit, rendering it inoperative.

Embodiments of the present disclosure are directed towards a stand-alone oscillator failure detect circuit (OFDC), located within an IC, that provides a reliable, unambiguous indication of a failure of an oscillator within an electronic system. In embodiments, such a circuit can be useful in initiating replacement of the failed oscillator with a working oscillator, and thus increasing overall reliability of the electronic system. An OFDC designed according to embodiments can be compatible with existing and proven electronic systems and ICs, and can be a useful and cost-effective way to detect an oscillator failure and initiate an operation to replace or swap out the failed oscillator. An OFDC constructed according to embodiments of the present disclosure can be included into an IC or electronic system.

Embodiments of the present disclosure can be relatively straightforward to design and fabricate in various IC technologies, and do not require the use of custom circuit elements or blocks which can be require complex design techniques or specialized semiconductor processing steps. Embodiments of the present disclosure can be implemented, for example, with circuit elements created using standard cell logic; custom logic elements are not necessary or necessarily advantageous in the practice of the present disclosure. For example, elements such as buffers, resistors, capacitors, N-channel field-effect transistors (NFETs), P-channel field-effect transistors (PFETs), Schmitt triggers and OR gates can all be implemented using standard cell logic blocks. Components such as capacitors and resistors can be implemented with standard cell blocks and/or can be formed by using NFETs and PFETs in various configurations.

Embodiments of the present disclosure can require relatively few components and can be easily integrated within existing IC designs. According to embodiments, the OFDC is not required to receive any clocks or other control signals from external logic other than the output of the oscillator it is configured to monitor; it can be used as a stand-alone function. No external logic is required to control or initialize any counters, state machines or latches, for example. The OFDC can detect a type of oscillator failure, and subsequently output signals indicating if the oscillator has failed with its output remaining in a logical "high" or logical "low" state.

Embodiments of the OFDC can be robust with respect to power supply noise; according to embodiments, the use of Schmitt trigger having hysteresis characteristics can cause the OFDC outputs, for example, reference fail (RF), reference fail low (RFL) and reference fail high (RFH), to be robust, i.e., not "glitch" or erroneously vary or transition in response to supply voltage noise spikes or variations. According to embodiments, an IC designer can specify resistor and capacitor values/ranges for the components in a pull-up network and a pull-down network of the OFDC in order to configure the OFDC to detect failed oscillators having various frequency ranges. According to embodiments, a cost-effective oscillator failure detection circuit for use with electronic systems can be created through the use of existing and proven IC design methodology and fabrication technologies.

Certain embodiments relate to providing, independent of other circuitry, an indication of the failure of an oscillator used to clock an electronic system. FIG. 1 includes block diagram depictions 100 and 150 of two clocked electronic systems that include at least one oscillator.

Clocked electronic system view 100 can be useful in providing a visual understanding of an electronic system including an IC 104A that is clocked by a primary oscillator 110A. It can be understood that clocked electronic system 100 generically represents of a wide variety of electronic systems such as computers, special-purpose computers and servers, as detailed above, which rely on a clock signal in order to properly function. While a particular component arrangement and interconnection scheme is depicted in view 100, a number of variations of these schemes are possible that include the components depicted and described herein.

In many electronic systems an oscillator is used to clock synchronous digital storage elements, e.g., latches, flip-flops and memory devices/arrays within the electronic system. Electronic system 100 includes primary oscillator 110A having oscillator output 120A. Primary oscillator 110A and IC 104A can be located, as depicted, on a printed circuit board (PCB) 102A.

In applications, primary oscillator 110A can include any of a large variety of circuits based upon tank or resonant circuits, for example, crystal oscillators. Primary oscillator 110A produces a regularly repeating oscillating waveform that can be distributed to logic circuits 112 to synchronize their operation and provide stable, well-controlled timing to the clocked electronic system 100. In embodiments, the reference clock (Ref_Clk) signal is received by the Ref_Clk input of the IC 104A from primary oscillator 110A output 120A. The Ref_Clk signal is used to provide timing for all of the logic circuits 112; this signal must be present and well-controlled in order to ensure a functioning clocked electronic system 100.

In some embodiments, the Ref_Clk input of the IC 104A can be electrically connected to a phase-locked loop (PLL) 106 of IC 104A. IC 104A also includes a clock distribution network 108 electrically connected to the output 126 of PLL 106. Clock distribution network 108 is configured to provide a plurality of clock signals 128 to logic circuits 112. In applications, PLL 106 can be used to align the phase of the clock signals 128 with the phase of the Ref_Clk input signal, to nullify the effects of clock signal propagation delay through clock distribution network 108. In applications that include multiple clock domains and corresponding PLLs 106, multiple PLLs 106 can be used to align clock signals from the multiple domains. In applications, PLL 106 drives a phase-altered copy of the Ref_Clk signal onto PLL output 126, which is received by clock distribution network 108.

In applications, clock distribution network 108 can include electrical interconnect structures such as clock grids, "tree" networks and "H-tree" networks and multiple levels of driver/buffer circuits used to provide synchronized copies of clock signals 128 to clocked circuit elements of logic circuits 112.

It can be noted that clocked electronic system 100 does not include a circuit to provide an indication of an oscillator failure. In the event of a failure of primary oscillator 110A, a Ref_Clk signal is not available to be phase-aligned by PLL 106, distributed by clock distribution network 108, and received by logic circuits 112. In the absence of a Ref_Clk signal, clocked electronic system 100 ceases to function.

According to embodiments, clocked electronic system view 150 can be useful in providing a visual understanding of an electronic system generally consistent with clocked electronic system 100. The functions of and electrical interconnections between PLL 106, clock distribution network 108 and logic circuits 112 are consistent with functions and interconnections described above in reference to clocked electronic system 100.

In addition to the above-described circuit elements, clocked electronic system 150 also includes secondary oscillator 110B, multiplexer (MUX) 114, OFDC 116, service processor 118 and electronic interconnections between the various circuit elements depicted in view 150. According to embodiments, the addition of these elements and associated electronic interconnections is particularly useful in configuring clocked electronic system 150 to detect a failure of primary oscillator 110A and, in response to the detection, functionally replace, i.e., swap, secondary oscillator 110B in place of primary oscillator 110A. This oscillator failure detection and swapping can be useful in restoring and maintaining a stable Ref_Clk signal to clock logic circuits 112 of clocked electronic system 150 following the failure of primary oscillator 110A.

According to embodiments, secondary oscillator 110B can be located on PCB 102B, with oscillator output 120B electrically connected to an input of MUX 114. Similarly, primary oscillator 110A can also be located on PCB 102B, with oscillator output 120A electrically connected to another input of MUX 114.

According to embodiments, MUX 114 is configured to establish, based upon a logical value of a signal received at the select input 122B, a connection between the primary oscillator 110A output 120A or the secondary oscillator 110B output 120B and the MUX output 120C. The select input 122B is received from a select output 122A of a service processor 118.

The connection established by MUX 114 allows one of two oscillator outputs to be connected to the Ref_Clk input of the IC 104B and can be useful in functionally replacing a failed oscillator, e.g., 110A with a functioning oscillator, e.g., 110B. The Ref_Clk input of the IC 104B is further connected to the Ref_Clk input of both the PLL 106 and the OFDC 116.

Certain embodiments (not depicted) can include an additional, e.g., third oscillator, with the MUX 114 accordingly, including one or more additional oscillator input(s). In embodiments, additional MUX inputs can be electrically connected to the output(s) of the additional oscillator(s). In such embodiments, the MUX 114 can be configured to provide, based upon a logical value of two or more bits of select input 122B, a connection from an output of the additional oscillator to the Ref_Clk input of the IC 104B.

In embodiments, OFDC 116 is included on IC 104B and is configured to monitor Ref_Clk input of the IC 104B and to detect, independent of control signals received from other circuitry, a steady-state (DC) voltage on the Ref_Clk input of the IC 104B. It can be understood that a steady-state (DC) voltage on the Ref_Clk input generally indicates a failure of an oscillator, e.g., primary oscillator 110A. The OFDC 116 is further configured to, in response to detecting the steady-state voltage, output an oscillator failure signal on at least one reference fail output (RFO) 124. OFDC 116 can be particularly useful for providing at least one unambiguous, binary "pass/fail" signal for indicating an oscillator failure.

Figure 2:
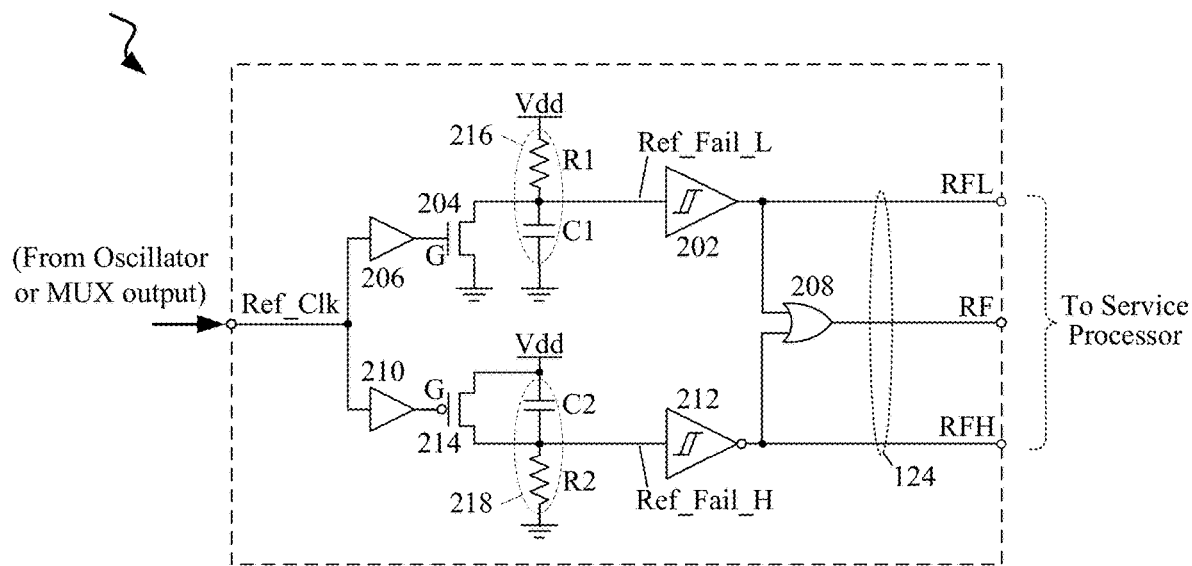
FIG. 2 is a schematic diagram of an oscillator failure detection circuit (OFDC), according to embodiments consistent with the figures.

According to embodiments, the RFO 124 can include an RF output, an RFH output and an RFL output, not depicted in FIG. 1. The RFL output is asserted when the oscillator output fails and remains at a logical "0" level. Similarly, the RFH output is asserted when the oscillator output fails and remains at a logical "1" level. The RF output is asserted when the oscillator output fails and remains at either a logical "0" or "1" level. The figures of the present disclosure illustrate and discuss a logical "1," as an assertion level for the RF, RFH and RFL signals, however, in some embodiments, the RF, RFH and RFL signals can be asserted as logical "0" levels. The RF, RFL and RFH outputs are depicted in FIG. 2 and discussed in greater detail in the associated text. According to embodiments, the RFO 124 are electrically connected to the service processor 118.

The service processor 118 is configured to, in response to receiving an indication of an oscillator failure on at least one RFO 124, drive the select input 122B of the MUX 114 to select an input electrically connected to the oscillator output 120B of the secondary oscillator 110B. According to embodiments, the service processor 118 can also be configured to issue warning messages indicating the failure of an oscillator, for example, a console, email, SMS, or other type of warning message can be sent to a system operator or technician. In embodiments the service processor 118 can be located either on a PCB 102B that includes the IC or external to PCB 102B. In some embodiments, the function of service processor 118 can be performed by, for example an external logic IC or other device/system. An external logic IC can include, for example, an ASIC, Field Programmable Gate Array (FPGA), programmable logic device (PLD) or similar programmable logic device.

FIG. 2 is a schematic diagram 116 of an OFDC, according to embodiments consistent with the figures. FIG. 2 can be useful in depicting the circuit topology of OFDC 116, consistent with FIG. 1. According to embodiments OFDC 116 is fabricated within an IC 104B and is configured to detect, independent of control signals received from other circuitry, a steady-state voltage on an oscillator output, e.g., oscillator output 120A or 120C, FIG. 1. The OFDC 116 is further configured to output an oscillator failure signal on RFO 124 in response to detecting the steady-state oscillator output voltage. It can be understood that a steady-state or DC voltage on the Ref_Clk input generally indicates an oscillator failure.

In some embodiments the buffers 206 and 210, pull-down device 204, pull-up device 214, pull-down network 218, pull-up network 216, Schmitt trigger 202, inverting Schmitt trigger 212 and the OR gate 208 functions can be implemented using standard cells. Implementation of these functions in standard cells can be particularly useful in avoiding the need for custom design methodologies that can be complicated, cost-prohibitive, and time-consuming and that can require specialized or unusual semiconductor process operations.

OFDC 116 is configured to receive the output of an oscillator, either directly or as selected by a MUX, e.g., 114, FIG. 1 at a Ref_Clk input, which is electrically connected to inputs of buffers 206 and 210. The outputs of buffers 206 and 210 are electrically connected to control inputs (G) of pull-down device 204 and pull-up device 214, respectively. In some embodiments, as depicted in FIG. 2, pull-down device 204 and pull-up device 214 can be an NFET and a PFET, respectively, where the control inputs are gate terminals (G). In some embodiments, pull-down device 204 and pull-up device 214 can be other types of devices, e.g., NPN and PNP transistors, having other types of control inputs.

The pull-down device 204 and pull-up device 214 can be useful for overriding the pull-up network 216 and pull-down network 218 during the normal functioning of an oscillator having an output that regularly toggles between logical "0" and logical "1" states.

Pull-up network 216 includes resistor R1, connected to a supply voltage ($V_{DD}$) and to the Ref_Fail_L node, and capacitor C1 connected to ground (GND) and to the Ref_Fail_L node. Terminals of pull-down device 204 are connected to GND and to the Ref_Fail_L node and pull-down device 204 is configured to draw the Ref_Fail_L node of pull-up network 216 to GND in response to a signal received from the output of the buffer 206. The Ref_Fail_L node is also connected to the input of the Schmitt trigger 202.

When the oscillator input Ref_Clk is at a logical "0" and pull-down device 204 is accordingly deactivated, the resistor R1 starts drawing the Ref_Fail_L node towards $V_{DD}$. When the Ref_Clk node is oscillating normally, and transitions to a logical "1" level, however, buffer 206 drives the gate (G) of pull-down device 204 to a logical "1," activating it, which draws the Ref_Fail_L node towards GND. As the Ref_Clk input continues to oscillate normally, this cycle continues.

A circuit designer can specify the values of resistor R1 and capacitor C1, in conjunction with an upper switching threshold of the Schmitt trigger 202, such that during normal operation of an oscillator providing the Ref_Clk input signal, the voltage on the Ref_Fail_L node never crosses the Schmitt trigger 202 upper threshold. Accordingly, the RFL output of the Schmitt trigger 202 remains in a logical "0" state, i.e., unasserted, indicating that that the Ref_Clk input signal is not remaining in a logical "0" state.

In the event of an oscillator failure such that the Ref_Clk input remains at a logical "0" state, i.e., a "stuck-at-0" failure, however, the output of buffer 206 remains low. Buffer 206 fails to activate pull-down device 204. In accordance with the RC time constant of pull-up network 216, resistor R1 pulls the Ref_Fail_L node towards $V_{DD}$, and it subsequently crosses the upper switching threshold of the Schmitt trigger 202, causing the RFL output of Schmitt trigger 202 to transition to a logical "1," or asserted state. This asserted state serves as an indication of a "stuck-at-0" oscillator failure.

Pull-down network 218 includes resistor R2, connected to GND and to the Ref_Fail_H node, and capacitor C2 connected to $V_{DD}$ and to the Ref_Fail_H node. Terminals of pull-up device 214 are connected to $V_{DD}$ and to the Ref_Fail_H node and pull-up device 214 is configured to draw the Ref_Fail_H node of pull-down network 218 to $V_{DD}$ in response to a signal received from the output of the buffer 210. The Ref_Fail_H node is also connected to the input of the Inverting Schmitt trigger 212.

When the oscillator input Ref_Clk is at a logical "1" and pull-up device 214 is accordingly deactivated, the resistor R2 starts drawing the Ref_Fail_H node towards GND. When the Ref_Clk node is oscillating normally, and transitions to a logical "0" level, however, buffer 210 drives the gate (G) of pull-up device 214 to a logical "0," activating it, which draws the Ref_Fail_H node towards $V_{DD}$. As the Ref_Clk input continues to oscillate normally, this cycle continues.

A circuit designer can specify the values of resistor R2 and capacitor C2, in conjunction with a lower switching threshold of the Inverting Schmitt trigger 212, such that during normal operation of an oscillator providing the Ref_Clk input signal, the voltage on the Ref_Fail_H node never crosses the Inverting Schmitt trigger 212 lower threshold. Accordingly, the RFH output of the Inverting Schmitt trigger 212 remains in a logical "low" state, i.e., unasserted.

In the event of an oscillator failure such that the Ref_Clk input remains at a logical "1" state, i.e., a "stuck-at-1" failure, however, the output of buffer 210 remains high. Buffer 210 fails to activate pull-up device 214. In accordance with the RC time constant of pull-down network 218, resistor R2 pulls the Ref_Fail_H node towards GND, and it subsequently crosses the lower switching threshold of the Inverting Schmitt trigger 212, causing the RFH output of Inverting Schmitt trigger 212 to transition to a logical "1," or asserted state. This asserted state serves as an indication of a "stuck-at-1" oscillator failure.

In embodiments, OR gate 208 receives, at inputs, both the RFL and RFH outputs, and accordingly, asserts a logical "1" on the RF output signal of the RFO 124 when either RFL or RFH outputs are asserted to a logical "1" state. Thus, the RF output signal serves as an indication of an oscillator failure, either a "stuck-at-0" or "stuck-at-1" failure. According to embodiments, the RFO 124 can be received by a service processor, e.g., 118, FIG. 1, which can subsequently respond, as discussed above.

Figure 3:
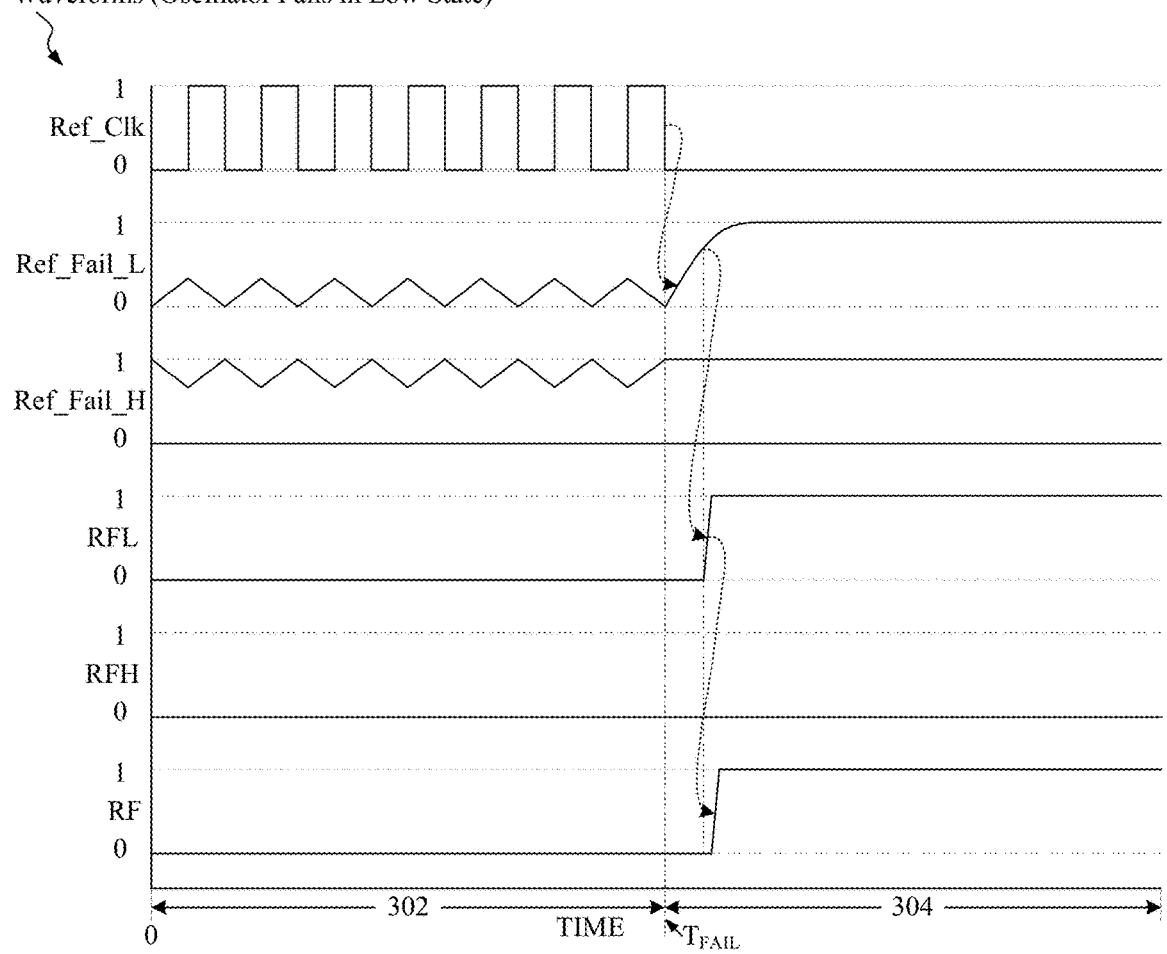
FIG. 3 depicts a set of waveform diagrams for an OFDC, according to embodiments consistent with the figures.

FIG. 3 depicts a set of waveform diagrams for an OFDC, e.g., 116, FIG. 2, according to embodiments consistent with the figures. FIG. 3 depicts signal waveforms of input signals, internal nodes, and output signals of an OFDC 116, FIG. 2, during both normal operation and during and "stuck-at-0" oscillator failure, according to embodiments. The waveforms depicted in FIG. 3 can provide a visual understanding of causal relationships between logical values of the input signal Ref_Clk and resulting values of the internal nodes Ref_Fail_L and Ref_Fail_H and the output nodes RFL, RFH and RF. FIG. 3 is used to depict the response of both internal signal nodes and output signals of the OFDC 116 of FIG. 2 to a functional oscillator input and to a "stuck-at-0" oscillator failure.

The vertical axis of FIG. 3 includes labels corresponding to an OFDC input signal, internal nodes and output signals. Progressing from the top of the vertical axis downwards, labels appear for the input signal Ref_Clk, for the Ref_Fail_L and Ref_Fail_H internal nodes, and for the RFL, RFH and RF output signals. Corresponding labels for logical "0" and logical "1" states for each of the input, internal node, and output signals are also provided alongside the signal names.

The waveforms depicted in FIG. 3 can generally be described in terms of time interval 302 and time interval 304. Time interval 302 refers to the time between 0 and the oscillator failure time ($T_{FAIL}$), as depicted below the x-axis of FIG. 3. Similarly, time interval 304 refers to the time following $T_{FAIL}$. The waveforms included in FIG. 3 are generally useful for providing a visual understanding of signal sequences and interactions, as previously described in reference to FIG. 2, with respect to detecting and providing indications of a "stuck-at-0" oscillator failure with an OFDC 116, FIG. 2.

Time interval 302 depicts an operational time interval in which the Ref_Clk signal, as provided by a properly functioning oscillator, e.g., 112, FIG. 1, is regularly oscillating between logical "0" and logical "1" states. During this time period, both pull-down device 204 and pull-up device 214 are regularly activated by the oscillation of their control inputs (G), and this activation of both devices prevents the Ref_Fail_L and Ref_Fail_H internal nodes, respectively, from crossing the switching thresholds of the Schmitt trigger 202 and inverting Schmitt trigger 212, respectively. Accordingly, the RFL and RFH outputs of respective Schmitt trigger 202 and inverting Schmitt trigger 212 remain in a non-asserted, i.e., in a logical "0" state during time interval 302. The RF output of OR gate 208 therefore also remains in a non-asserted, i.e., logical "0" state during this time interval.

At $T_{FAIL}$, the Ref_Clk input remains at a logical "0" state, consistent with the output of an oscillator experiencing a "stuck-at-0" failure. As a result, the pull-down device 204 is not activated, and the Ref_Fail_L node is drawn to $V_{DD}$ by resistor R1, causing the RFL output to transition to a logical "1," followed by the RF output transitioning, due to the operation of OR gate 208, to a logical "1." The assertion of a logical "1" on the RFL and RF outputs serves as an indication of a "stuck-at-0" oscillator failure. Such an assertion can be recognized and responded to by a service processor, e.g., 118, FIG. 1.

Simultaneously, the pull-up device 214 is activated by the application of the Ref_Clk input remaining at a logical "0" state, which causes the Ref_Fail_H node to be drawn to $V_{DD}$ by pull-up device 214. The application of this logical "1" to the input of inverting Schmitt trigger 212 causes the RFH output to remain at a logical "0," or non-asserted state. Assuming the Ref_Clk input remains at a logical "0" state throughout time interval 304, the RFH, RFL and RF outputs will remain in the logical states described above for the remainder of time interval 304.

Figure 4:
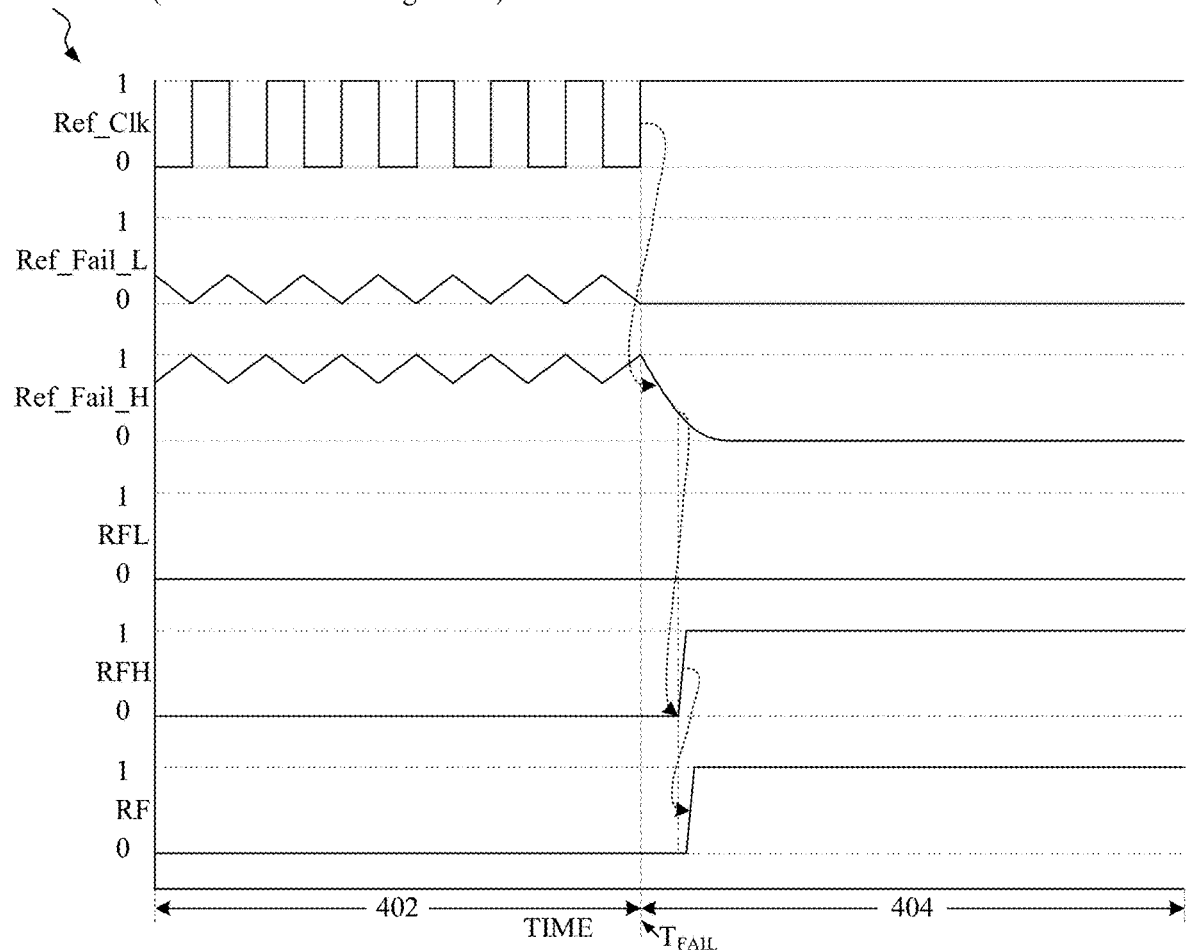
FIG. 4 depicts a set of waveform diagrams for an OFDC, according to embodiments consistent with the figures.

FIG. 4 depicts a set of waveform diagrams for an OFDC, e.g., 116, FIG. 2, according to embodiments consistent with the figures. FIG. 4 depicts signal waveforms of input signals, internal nodes, and output signals of an OFDC 116, FIG. 2, during both normal operation and during and "stuck-at-1" oscillator failure, according to embodiments. The waveforms depicted in FIG. 4 can provide a visual understanding of causal relationships between logical values of the input signal Ref_Clk and resulting values of the internal nodes Ref_Fail_L and Ref_Fail_H and the output nodes RFL, RFH and RF. FIG. 4 is used to depict the response of both internal signal nodes and output signals of the OFDC 116 of FIG. 2 to a functional oscillator input and to a "stuck-at-1" oscillator failure.

The vertical axis of FIG. 4 includes labels corresponding to an OFDC input signal, internal nodes and output signals. Progressing from the top of the vertical axis downwards, labels appear for the input signal Ref_Clk, for the Ref_Fail_L and Ref_Fail_H internal nodes, and for the RFL, RFH and RF output signals. Corresponding labels for logical "0" and logical "1" states for each of the input, internal node, and output signals are also provided alongside the signal names.

The waveforms depicted in FIG. 4 can generally be described in terms of time interval 402 and time interval 404. Time interval 402 refers to the time between 0 and $T_{FAIL}$, as depicted below the x-axis of FIG. 4. Similarly, time interval 404 refers to the time following $T_{FAIL}$. The waveforms included in FIG. 4 are generally useful for providing a visual understanding of signal sequences and interactions, as previously described in reference to FIG. 2, with respect to detecting and providing indications of a "stuck-at-1" oscillator failure with an OFDC 116, FIG. 2.

Time interval 402 depicts an operational time interval in which the Ref_Clk signal, as provided by a properly functioning oscillator, e.g., 112, FIG. 1, is regularly oscillating between logical "0" and logical "1" states. During this time period, both pull-down device 204, FIG. 2 and pull-up device 214, FIG. 2, are regularly activated by the oscillation of their control inputs (G), and this activation of both devices prevents the Ref_Fail_L and Ref_Fail_H internal nodes, respectively, from crossing the switching thresholds of the Schmitt trigger 202 FIG. 2, and inverting Schmitt trigger 212, FIG. 2, respectively. Accordingly, the RFL and RFH outputs of respective Schmitt trigger 202 FIG. 2, and inverting Schmitt trigger 212 FIG. 2, remain in a non-asserted, i.e., in a logical "0" state during time interval 402. The RF output of OR gate 208, FIG. 2, therefore also remains in a non-asserted, i.e., logical "0" state during this time interval.

At $T_{FAIL}$, the Ref_Clk input remains at a logical "1" state, consistent with the output of an oscillator experiencing a "stuck-at-1" failure. As a result, the pull-up device 214 is not activated, and the Ref_Fail_H node is drawn to GND by resistor R2, causing the RFH output to transition to a logical "1," followed by the RF output transitioning, due to the operation OR gate 208, to a logical "1." The assertion of a logical "1" on the RFH and RF outputs serves as an indication of a "stuck-at-1" oscillator failure. Such an assertion can be recognized and responded to by a service processor, e.g., 118, FIG. 1.

Simultaneously, the pull-down device 204 is activated by the application of the Ref_Clk input remaining at a logical "1" state, which causes the Ref_Fail_L node to be drawn to GND by pull-down device 204. The application of this logical "0" to the input of Schmitt trigger 202 causes the RFL output to remain at a logical "0," or non-asserted state. Assuming the Ref_Clk input remains at a logical "1" state throughout time interval 404, the RFH, RFL and RF outputs will remain in the logical states described above for the remainder of time interval 404.

Figure 5:
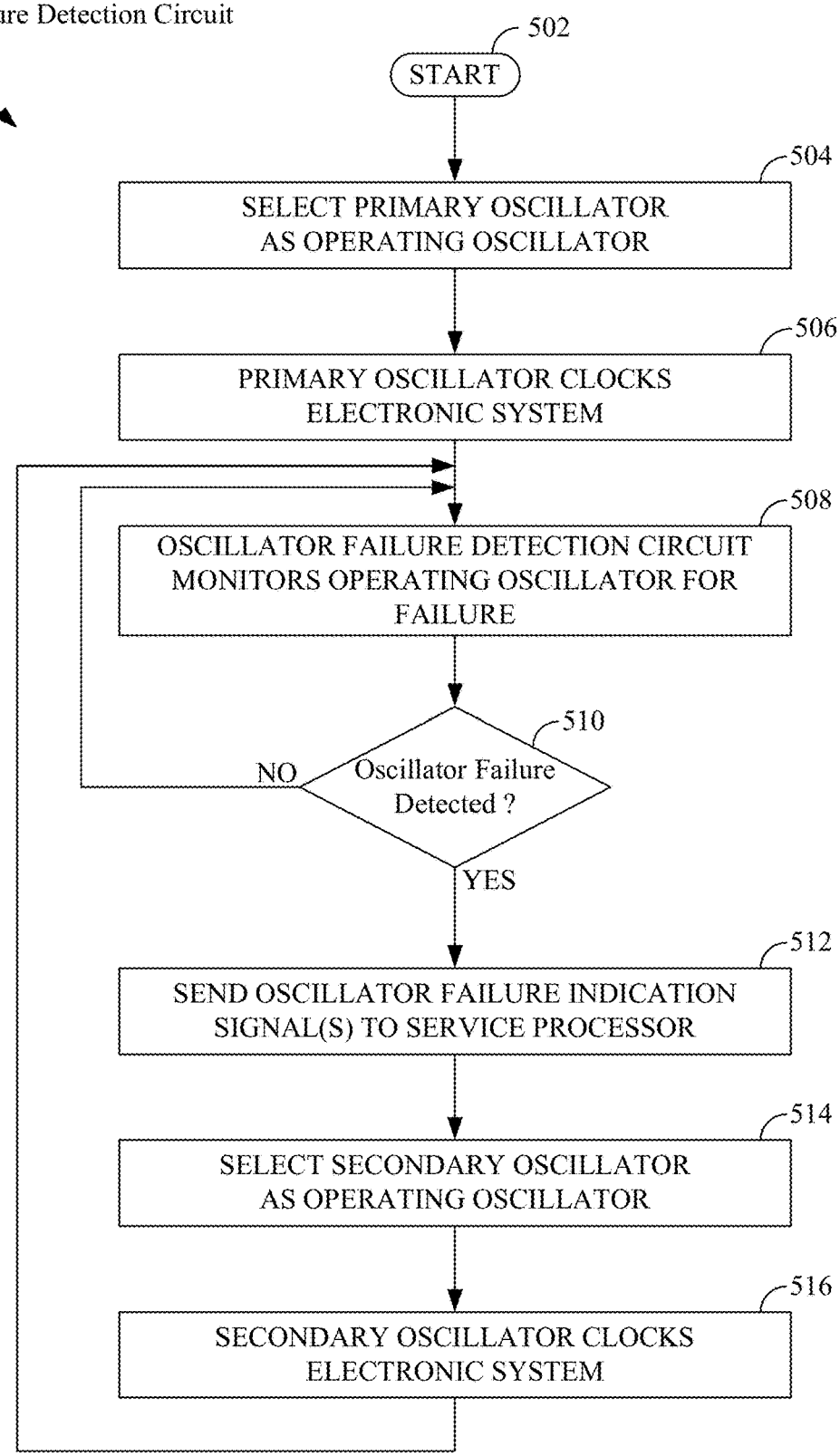
FIG. 5 is a flow diagram depicting a method for operating a clocked electronic system using an OFDC, according to embodiments consistent with the figures.

FIG. 5 is a flow diagram 500 depicting a method for operating a clocked electronic system 150, FIG. 1, using an OFDC 116, according to embodiments consistent with the figures. OFDC 116 is configured to detect, independent of control signals received from other circuitry, a steady-state voltage on an oscillator output 120A and, in response to detecting the steady-state voltage, output an oscillator failure signal on at least one RFO 124.

The use of method 500 can be useful in providing reliable, cost-effective detection of an oscillator failure within an electronic system and in initiating the swapping out or replacement of such a failed oscillator. These operations can significantly increase the overall reliability and availability of an electronic system such as a computer, server, supercomputer, cloud device, AI system, telecom system, and the like.

The method 500 moves from start 502 to operation 504. Operation 504 generally refers to selecting primary oscillator 110A as an operating oscillator for the electronic system 150, FIG. 1. According to embodiments, the oscillator selection can be performed with a service processor, e.g., 118, FIG. 1, or other logic function within the clocked electronic system 150. A service processor can assert one or more select signals onto a select input 122B of a MUX, e.g., 114, FIG. 1, in order to determine which oscillator output is selected by the MUX 114, FIG. 1, and driven to the Ref_Clk input of clocked electronic system 150. Once the primary oscillator 110A has been selected as an operating oscillator for the electronic system, the method 500 moves to operation 506.

Operation 506 generally refers to clocking the electronic system 150, FIG. 1, with the primary oscillator 110A. A Ref_Clk signal received by clocked electronic system 150 from primary oscillator 110A can be phase-aligned with PLL 106 and have copies distributed and redriven by clock distribution network 108. The copies of the Ref_Clk signal are subsequently used to clock synchronous portions of logic circuits 112. Such clocking enables the proper, timed functioning of clocked electronic system 150. Once the electronic system 150 has been clocked, the method 500 moves to operation 508.

Operation 508 generally refers to monitoring the operating oscillator for a failure condition. According to embodiments, a Ref_Clk signal received from an oscillator output can be monitored, as described in reference to FIGS. 1 and 2, with an OFDC 116, FIG. 1, for a failure condition such as a "Stuck-at-0" or a "Stuck-at-1" failure. The OFDC is configured to determine if there was an oscillator failure and also to determine which logic state the oscillator output is remaining at. The OFDC's RFL, RFH, and RF outputs serve to indicate these failure types to a service processor 118, FIG. 1, for example. Once the operating oscillator has been monitored for a failure condition, the method 500 moves to operation 510.

At operation 510, a determination is made by the OFDC 116, FIG. 1, regarding if an oscillator failure has been detected or not. According to embodiments, if the RF output is asserted to a logical "1," then an oscillator failure has occurred. Such a determination is generally made by the OFDC within approximately one clock cycle following the oscillator failure. If an oscillator failure has been not detected, the method 500 returns to operation 508. If an oscillator failure has been detected, the method 500 moves to operation 512.

Operation 512 generally refers to sending, with the OFDC 116, FIG. 1 at least one RFO 124 signal to the service processor 118, FIG. 1. According to embodiments, at least one RFO 124 signal net is electrically connected to service processor 118, FIG. 1, through a connection such as wires, over which the RF, RFL, and RFH signals can be transmitted. In embodiments discussed herein, the RF, RFL, and RFH signals are asserted as "active high" signals, meaning that a logical "1" value of any of these signals indicates an oscillator failure. In certain embodiments, the RF, RFL, and RFH signals can be asserted as "active low" signals. Once the at least one RFO 124 signal has been sent to the service processor 118, FIG. 1, the method 500 moves to operation 514.

Operation 514 generally refers to selecting secondary oscillator 110B, FIG. 1, as an operating oscillator for the electronic system 150, FIG. 1. According to embodiments, the oscillator selection can be performed with a service processor, e.g., 118, FIG. 1, or other logic function within the clocked electronic system 150. A selection operation can be performed in response to receiving at least one RFO 124 signal from the OFDC 116, per operation 512, that indicates a failure of a primary oscillator, e.g., 110A, FIG. 1.

A service processor can assert one or more select signals onto a select input 122B of a MUX, e.g., 114, FIG. 1, in order to determine which oscillator output is selected by the MUX 114, FIG. 1, and subsequently driven to the Ref_Clk input of clocked electronic system 150. In some embodiments, the secondary oscillator 110B can have an operating frequency that is consistent with the operating frequency of the primary oscillator 110A. In some embodiments, the service processor 118 can also send a console, email, Short Messaging Service (SMS), or other type of warning message to a system operator or technician regarding the detected oscillator failure. Once the secondary oscillator 110B, FIG. 1 has been selected as an operating oscillator for the electronic system 150, FIG. 1, the method 500 moves to operation 516.

Operation 516 generally refers to clocking the electronic system 150, FIG. 1, with the secondary oscillator 110B. A Ref_Clk signal received by clocked electronic system 150, FIG. 1 from secondary oscillator 110B can be phase-aligned with PLL 106, have copies distributed and redriven by clock distribution network 108, and subsequently the copies of the Ref_Clk signal can be used to clock synchronous portions of logic circuits 112. Such clocking enables the proper, timed functioning of clocked electronic system 150. Once the electronic system 150 has been clocked, the method 500 returns to operation 508.

The descriptions of the various embodiments of the present disclosure have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to explain the principles of the embodiments, the practical application or technical improvement over technologies found in the marketplace, or to enable others of ordinary skill in the art to understand the embodiments disclosed herein.

What is claimed is:

1. An oscillator failure detection circuit (OFDC) comprising:
   a reference clock input configured to receive an oscillator output signal, the reference clock input electrically connected to an input of a first buffer and to an input of a second buffer;
   a pull-down device having a control input electrically connected to an output of the first buffer, the a pull-down device configured to, in response to a signal received from the output of the first buffer, draw a node of a pull-up network to ground;
   a pull-up device having a control input electrically connected to an output of the second buffer, the a pull-up device configured to, in response to a signal received from the output of the second buffer, draw a node of a pull-down network to a supply voltage;
   a Schmitt trigger having an input electrically connected to the node of the pull-up network, an output of the Schmitt trigger electrically connected to a first input of an OR-gate;
   an inverting Schmitt trigger having an input electrically connected to the node of the pull-down network, an output of the inverting Schmitt trigger electrically connected to a second input of an OR-gate; and
   an output of the OR-gate electrically connected to the RFO;
   wherein the OFDC is configured to detect, independent of control signals received from other circuitry, a steady-state voltage on an oscillator output, the OFDC further configured to, in response to detecting the steady-state voltage, output an oscillator failure signal on a reference fail output (RFO).

2. The OFDC of claim 1, wherein the pull-up device is a P-channel field-effect transistor (PFET).

3. The OFDC of claim 1, wherein the pull-down device is an N-channel field-effect transistor (NFET).

4. The OFDC of claim 1, wherein a reference fail high (RFH) output is electrically connected to an output of the inverting Schmitt trigger.

5. The OFDC of claim 4, wherein the RFH output is configured to provide an indication of an oscillator output failing by maintaining a logical "1" state.

6. The OFDC of claim 1, wherein a reference fail low (RFL) output is electrically connected to an output of the Schmitt trigger.

7. The OFDC of claim 6, wherein the RFL output is configured to provide an indication of an oscillator output failing by maintaining a logical "0" state.

8. The OFDC of claim 1, wherein the first buffer, the second buffer, the pull-down device, the pull-up device, the pull-down network, the pull-up network, the Schmitt trigger, the inverting Schmitt trigger and the OR-gate functions are implemented using standard cells.

9. The OFDC of claim 1, wherein the pull-up network includes a first resistor and a first capacitor each electrically connected to the input of the Schmitt trigger, and wherein the pull-down network includes a second resistor and a second capacitor each electrically connected to the input of the inverting Schmitt trigger.

10. An apparatus for operating a clocked electronic system using an oscillator failure detection circuit (OFDC), the apparatus comprising:
an integrated circuit (IC) including the OFDC and further including a reference clock input configured to receive an oscillator output signal from a multiplexer (MUX) output;
the MUX including:
a first input, electrically coupled to an output of a primary oscillator;
a second input, electrically coupled to an output of a secondary oscillator;
a select input, electrically connected to a select output of a service processor; and
an output, electrically connected to the reference clock input of the IC, the MUX configured to provide, based upon a logical value of a signal received at the select input, a connection from an output of one of the primary oscillator and of the secondary oscillator to the reference clock input of the IC;
the OFDC including:
a reference clock input electrically connected to the reference clock input of the IC;
the RFO electrically connected to the service processor, the OFDC configured to indicate, in response to monitoring the clock input, an oscillator failure on the RFO;
wherein the service processor configured to, in response to receiving on the RFO, an indication of an oscillator failure, drive the select input of the MUX to select an input electrically connected to the output of the secondary oscillator; and
wherein the OFDC is configured to detect, independent of control signals received from other circuitry, a steady-state voltage on an oscillator output, the OFDC further configured to, in response to detecting the steady-state voltage, output an oscillator failure signal on a reference fail output (RFO).

11. The apparatus of claim 10, wherein the service processor is located on a printed circuit board (PCB) that includes the IC.

12. The apparatus of claim 10, wherein the service processor is located external to a printed circuit board (PCB) that includes the IC.

13. The apparatus of claim 10, further comprising an additional oscillator, wherein the MUX further includes an additional input, electrically coupled to an output of the additional oscillator, and wherein the MUX is further configured to provide, based upon a logical value of at least one signal received at the select input, a connection from an output of the additional oscillator to the reference clock input of the IC.

14. The apparatus of claim 10, further comprising a phase-locked loop (PLL) having in input electrically connected to the reference clock input of the IC.

15. The apparatus of claim 14, further comprising a clock distribution network driven by an output of the PLL.

16. A method for operating a clocked electronic system using an oscillator failure detection circuit (OFDC), the method comprising:
selecting, with a service processor, a primary oscillator as an operating oscillator for the electronic system;
clocking, with the primary oscillator, the electronic system;
monitoring, with the OFDC, the operating oscillator for a failure condition;
detecting, with the OFDC, the failure condition;
sending, with the OFDC, to the service processor, an RFO signal;
selecting, with the service processor, in response to receiving an RFO signal from the OFDC, a secondary oscillator as an operating oscillator for the electronic system; and
clocking, with the secondary oscillator, the electronic system;
wherein the OFDC is configured to detect, independent of control signals received from other circuitry, a steady-state voltage on an oscillator output, the OFDC further configured to, in response to detecting the steady-state voltage, output an oscillator failure signal on a reference fail output (RFO).

17. The method of claim 16, wherein the failure condition includes a steady-state voltage corresponding to a logical "0" state on an oscillator output.

18. The method of claim 16, wherein the failure condition includes a steady-state voltage corresponding to a logical "1" state on an oscillator output.

19. The method of claim 16, further comprising:
selecting, with the service processor, in response to receiving an RFO signal from the OFDC, an additional oscillator as an operating oscillator for the electronic system; and
clocking, with the additional oscillator, the electronic system.

20. The method of claim 16, wherein the RFO signal includes an output selected from the group consisting of: a reference fail (RF) output, a reference fail low (RFL) output and a reference fail high (RFH) output.

* * * * *